United States Patent
Fiorenza et al.

(10) Patent No.: US 10,522,389 B2
(45) Date of Patent: Dec. 31, 2019

(54) TRANSFER PRINTING METHOD

(71) Applicant: Analog Devices, Inc., Norwood, MA (US)

(72) Inventors: James Fiorenza, Carlisle, MA (US); F. Jacob Steigerwald, North Andover, MA (US); Edward F. Gleason, Cambridge, MA (US); Susan L. Feindt, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/923,828

(22) Filed: Oct. 27, 2015

(65) Prior Publication Data

US 2016/0118281 A1    Apr. 28, 2016

Related U.S. Application Data

(60) Provisional application No. 62/069,650, filed on Oct. 28, 2014.

(51) Int. Cl.
*G03F 7/00* (2006.01)
*H01L 21/762* (2006.01)
*H01L 25/065* (2006.01)
*H01L 25/00* (2006.01)
(Continued)

(52) U.S. Cl.
CPC ............ *H01L 21/7624* (2013.01); *G03F 7/00* (2013.01); *H01L 25/0657* (2013.01); *H01L 25/50* (2013.01); *H01L 21/67144* (2013.01); *H01L 23/525* (2013.01); *H01L 2224/18* (2013.01); *H01L 2224/24* (2013.01); *H01L 2224/73267* (2013.01); *H01L 2224/82* (2013.01); *H01L 2224/92244* (2013.01); *H01L 2225/06524* (2013.01); *H01L 2225/06541* (2013.01); *H01L 2225/06593* (2013.01)

(58) Field of Classification Search
None
See application file for complete search history.

(56) References Cited

U.S. PATENT DOCUMENTS

| | | | |
|---|---|---|---|
| 5,446,960 A | 9/1995 | Isaacs et al. | 29/834 |
| 5,817,242 A | 10/1998 | Biebuyck et al. | 216/41 |
| 8,039,847 B2 | 10/2011 | Nuzzo et al. | 257/79 |

(Continued)

FOREIGN PATENT DOCUMENTS

| | | |
|---|---|---|
| JP | 2007027693 A | 2/2007 |
| JP | 2018501636 A | 1/2018 |
| WO | WO-2016069546 A1 | 5/2016 |

OTHER PUBLICATIONS

International Searching Authority, International Search Report—International Application No. PCT/US2015/057495, dated Feb. 11, 2016, together with the Written Opinion of the International Searching Authority, 12 pages.

(Continued)

*Primary Examiner* — Joshua D Zimmerman
(74) *Attorney, Agent, or Firm* — Schwegman Lundberg & Woessner, P.A.

(57) ABSTRACT

A transfer printing method provides a first wafer having a receiving surface, and removes a second die from a second wafer using a die moving member. Next, the method positions the second die on the receiving surface of the first wafer. Specifically, to position the second die on the receiving surface, the first wafer has alignment structure for at least in part controlling movement of the die moving member.

20 Claims, 16 Drawing Sheets

(51) Int. Cl.
   *H01L 21/67*   (2006.01)
   *H01L 23/525*  (2006.01)

(56) References Cited

U.S. PATENT DOCUMENTS

| | | |
|---|---|---|
| 2005/0124092 A1 | 6/2005 | Bona et al. .................. 438/107 |
| 2011/0266561 A1 | 11/2011 | Rogers et al. .................. 257/88 |
| 2012/0032377 A1 | 2/2012 | Montenlius et al. ......... 264/408 |

OTHER PUBLICATIONS

Bower et al., "Transfer-printed Microscale Integrated Circuits," 59$^{th}$ Electronic Components and Technology Conference, pp. 618-623, May 2009.

Feng et al, "Competing Fracture in Kinetically Controlled Transfer Printing," Langmuir, vol. 23, No. 25, pp. 12555-12560, 2007.

Meitl et al., "Transfer printing by kinetic control of adhesion to an elastomeric stamp," Nature Materials, vol. 5, pp. 33-38, Jan. 2006.

Menard et al., "Transfer Printed Heterogeneous Integrated Circuits," CS MANTECH Conference, Austin, Texas, 3 pages, May 14-17, 2007.

Yoon et al., "GaAs photovoltaics and optoelectronics using releasable multilayer epitaxial assemblies," Nature, vol. 465, Issue 7296, pp. 329-333, May 20, 2010.

"International Application Serial No. PCT/US2015/057495, International Preliminary Report on Patentability dated May 11, 2017", 6 pgs.

"Chinese Application Serial No. 201580058384.5, Office Action dated Aug. 13, 2019", w/ English Translation, 27 pgs.

TRANSFER PRINTING METHOD

PRIORITY

This patent application claims priority from provisional U.S. patent application No. 62/069,650, filed Oct. 28, 2014, entitled, "TRANSFER PROCESSING OF INTEGRATED CIRCUITS," and naming James Fiorenza as inventor, the disclosure of which is incorporated herein, in its entirety, by reference.

FIELD OF THE INVENTION

This disclosure generally relates to fabricating integrated circuits and, more particularly, this disclosure relates to transfer printing integrated circuits.

BACKGROUND OF THE INVENTION

Multiple independently formed integrated circuit dice often are mechanically and electrically coupled to form a combination electronic product. To that end, some processes separately fabricate two or more integrated circuit dice, and then combine those integrated circuit dices using conventional processes, such as transfer printing processes. During the transfer printing process, an integrated circuit die typically is removed from a first wafer and positioned in close proximity to a second integrated circuit die. At some point thereafter, the process electrically connects the two integrated circuit dice to produce the combination electronic product.

SUMMARY OF VARIOUS EMBODIMENTS

In accordance with one embodiment of the invention, a transfer printing method provides a first wafer having a receiving surface, and removes a second die from a second wafer using a die moving member. Next, the method positions the second die on the receiving surface of the first wafer. Specifically, to position the second die on the receiving surface, the first wafer has alignment structure for at least in part controlling movement of the die moving member.

The receiving surface may form a receiving plane, and the alignment structure may have at least one wall extending from the receiving surface. At least part of the at least one wall preferably is non-orthogonally oriented relative to the receiving plane. The method thus may slide the second die along the at least one wall (at an angle to the normal of the receiving plane) until the second die contacts the receiving surface. Moreover, the at least one wall may include a plurality of walls that at least in part define the receiving surface. In that case, the method further may slide the second die along one or more of the plurality of walls until the die contacts the receiving surface.

Some embodiments of the die moving member are configured to move downwardly to position the second die on the receiving surface. In that case, the die moving member may include an elongated portion configured to move both: A) normal to the downward direction in response to the alignment structure, and B) in the downward direction. To facilitate this movement, the die moving member may include a stamp formed at least in part from a flexible material having a Young's Modulus of less than about 1 MPa.

The alignment structure may be implemented in a number of other configurations. For example, the alignment structure may include a magnetic structure configured to at least in part control movement of the die moving member. As another example, the alignment structure may include electrostatic structure configured to at least in part control movement of the die moving member.

Various processes may integrate the two dice. To that end, the method may passivate the second die, and electrically connect the second die to a first die that is part of the first wafer. Some embodiments may passivate both the first die and the second die.

In accordance with another embodiment, a transfer printing method provides a first wafer having a plurality of receiving surfaces, and then removes, using at least one die moving member, a plurality of second dice from a second wafer. Next, the method positions, in a single act by the at least one moving member, the plurality of second dice on the plurality of receiving surfaces. Each receiving surface preferably has at least one of the second dice. The first wafer has alignment structure configured to at least in part control movement of the die moving member to position the second dice on the plurality of receiving surfaces.

In accordance with other embodiments, a transfer printing method provides a first wafer having a receiving surface, and a second wafer having a second die. The method also causes a controlling means to move the second die from the second wafer to the first wafer, and positions, using the controlling means, the second die on the receiving surface of the first wafer. The first wafer has means for at least in part controlling movement of the die moving means to position the second die on the receiving surface.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Illustrative embodiments more precisely integrate two dice formed on separate wafers into a single, monolithic integrated circuit. To that end, a die moving member may transfer a donor die from a donor wafer to a pre-specified location on a receiving wafer. To ensure precise placement of the donor die, the receiving wafer has alignment structure that controls movement of the die moving member. Accordingly, this alignment structure cooperates with the die moving member to more precisely position the donor die on the receiving wafer. In some embodiments, this precision can be within the single microns (e.g., within about 2 or 3 microns). Details of various embodiments are discussed below.

Figure 1:
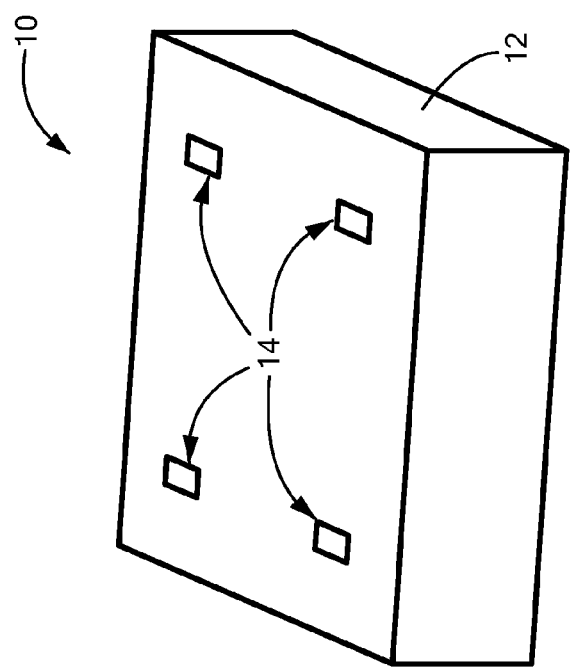
FIG. 1 schematically shows an integrated circuit that may be fabricated in accordance with illustrative embodiments of the invention.

FIG. 1 schematically shows a monolithic integrated circuit 10 fabricated in accordance with illustrative embodiments of the invention. More specifically, the integrated circuit 10 preferably is formed by at least two separate dice that each are formed on separate wafers. In illustrative embodiments, one of the dice may be formed in a first process to have a first type of circuitry, while the second of the dice may be formed in a separate, second process to have different circuitry. In other words, fabrication of the first die is decoupled from fabrication of the second die.

This decoupling enables a wide variety of potential dice combinations, such as III-V semiconductor device/CMOS device combinations, which generally present difficulties if attempting to form them with the same or coupled process. Specifically, growth of III-V semiconductor devices is more difficult on silicon because of the lattice mismatch between silicon and III-V materials. Also, the process used to fabricate III-V devices, such as gold metallization, often are not compatible with CMOS devices. As shown below, illustrative embodiments preferably take a monolithic approach to combine two disparate dice, such as dice with III-V devices and dice with CMOS devices. Among other benefits, the ultimate integrated circuit 10 preferably has:

1) reduced parasitics,
2) a smaller footprint,
3) capability of parallel/rapid processing, and/or
4) the capability of being formed using layer transfer processing with small dice.

Among other things, the first die may have conventional circuitry 20A, while the second die may have high-performance circuitry 20B. For example, the first die may have conventional silicon CMOS circuitry, while the second die may include III-V semiconductor circuitry. Among other things, that III-V circuitry may include at least one of the following types of circuitry:

gallium arsenide ("GaAs") devices,
high electron mobility transistors ("HEMT"),
metal semiconductor field effect transistors ("MESFET"),
heterojunction bipolar transistors ("HBT," see below),
indium phosphide HBT or HEMT ("InP-HEMT"), and
gallium nitride HEMT.

Accordingly, the integrated circuit 10 of FIG. 1 can implement a wide variety of applications. For example, the integrated circuit 10 can be used in silicon display backplanes, gallium arsenide solar cells, gallium arsenide MESFET arrays, and gallium arsenide infrared imagers. Of course, the different types of circuitry and dice described above and their applications are merely examples and not intended to limit various embodiments of the invention. Clearly, the first and second dice can be implemented as other circuitry and devices.

Specifically, only one or neither of the dice may be implemented as CMOS circuitry or a III-V semiconductor device. For example, one or both may be implemented as microelectromechanical systems devices (i.e., "MEMS devices"), or the same device. As another example, if implemented as a III-V semiconductor device, the second die may be formed with circuitry 20B that is not in the above noted list of devices. Moreover, the integrated circuit 10 may have more than two dice formed with the same or disparate processes. For example, the integrated circuit 10 may have 3 dice, 4 dice, or 5 dice, and those dice may have different circuitry, or have some overlap in makeup and functionality (e.g., 2 dice are the same type of device and the rest is/are a different type of device(s)).

As with many other such devices, the integrated circuit 10 of FIG. 1 has an exterior package 12 that protects the two or more noted dice (not shown in FIG. 1). One (or more) surfaces of the package 12 also has a plurality of electrical interfaces 14 for interconnecting with the dice within the package 12. For example, the electrical interfaces 14 may include conventional metal pads that may be soldered with a bonding wire or other electrically interconnect (e.g., a flip-chip connection) to permit electrical communication between the dice and other electronic devices. The integrated circuit 10 may be mounted on a printed circuit board (not shown) within a larger system (e.g., a computer system, smart phone, etc.). Accordingly, using the interfaces 14 on its outside surface, the integrated circuit 10 can communicate with other circuitry both on and off its circuit board.

Figure 2:
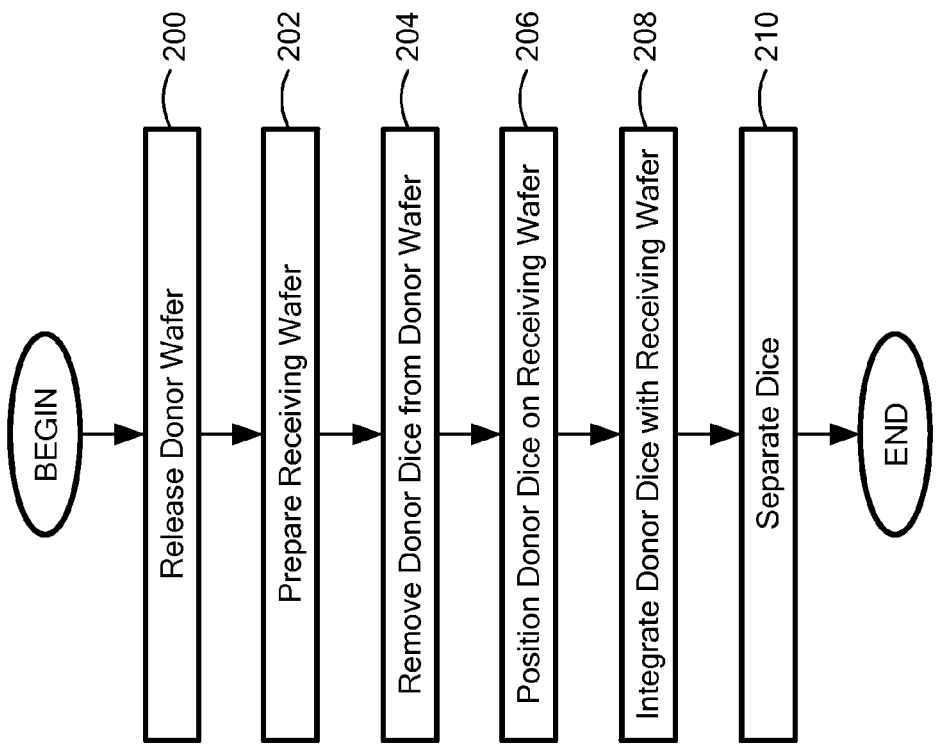
FIG. 2 shows a process of forming the integrated circuit of FIG. 1 in accordance with illustrative embodiments of the invention.
Figure 3:
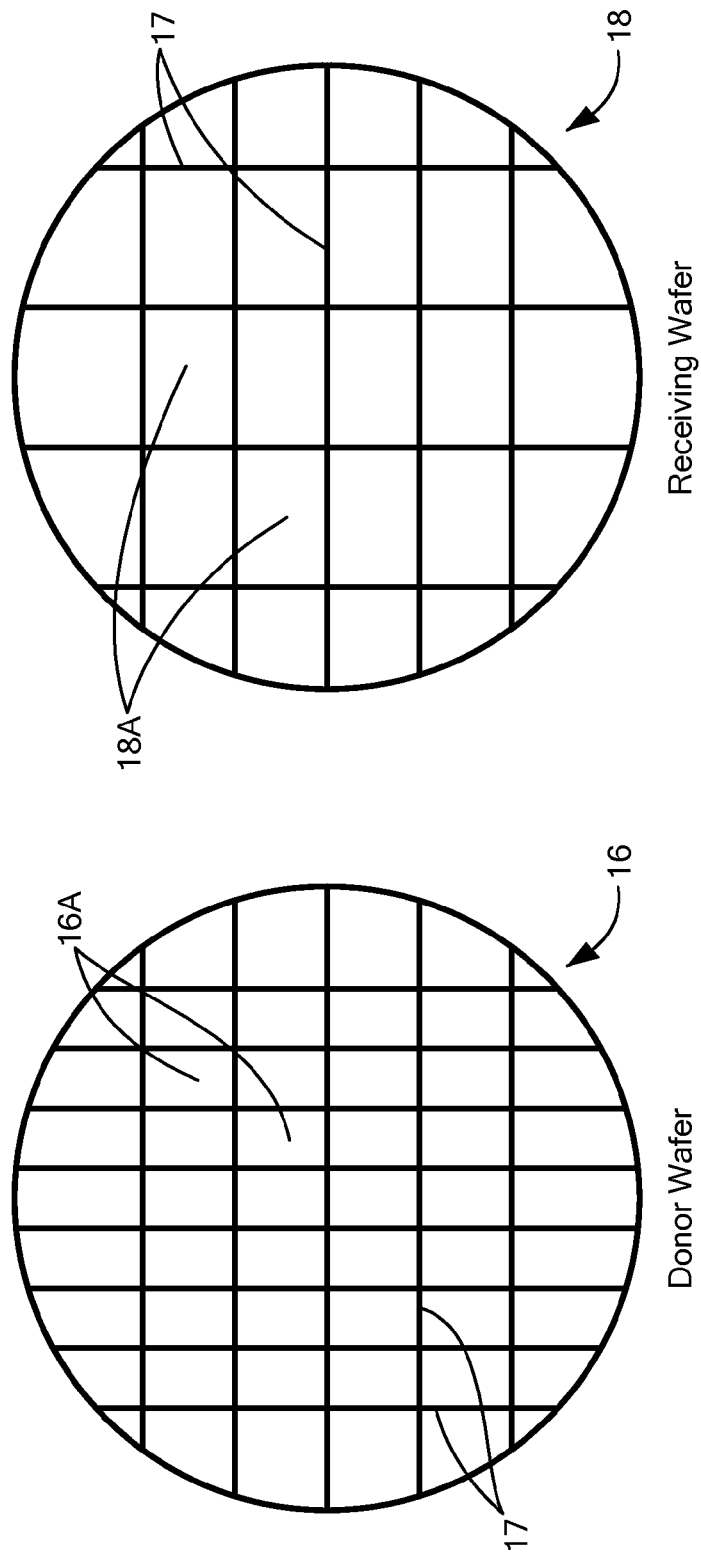
FIG. 3 schematically shows two wafers having dice that can be combined to form the integrated circuit of FIG. 1.

FIG. 2 shows a transfer printing process of forming the integrated circuit 10 of FIG. 1 in accordance with illustrative embodiments of the invention. Generally speaking, this method uses transfer printing to remove "donor dice 16A" from a donor wafer 16, move those donor dice 16A to prescribed locations on a receiving wafer 18, and integrate the donor dice 16A with the receiving wafer 18. FIG. 3 schematically shows one embodiment of the donor wafer 16 and the receiving wafer 18. Each wafer has a two-dimensional array of dice (16A or 18A) separated by scribe streets 17. Indeed, as merely schematic drawings, those skilled in the art should understand that the two wafers can have different numbers of dice, different sizes, different sized dice, etc.

It should be noted that the process of FIG. 2 is substantially simplified from a longer process that normally would be used to form the integrated circuit 10. Accordingly, the process of forming the integrated circuit 10 may have many other steps, such as testing steps, additional etching steps, or additional passivation steps, which those skilled in the art likely would use. In addition, some of the steps may be performed in a different order than that shown, or at the same time. Those skilled in the art therefore can modify the process as appropriate. Moreover, as noted above and below, many of the materials and structures noted are but examples of a wide variety of different materials and structures that may be used. Those skilled in the art can select the appropriate materials and structures depending upon the application and other constraints. Accordingly, discussion of specific materials and structures is not intended to limit all embodiments.

Figure 4:
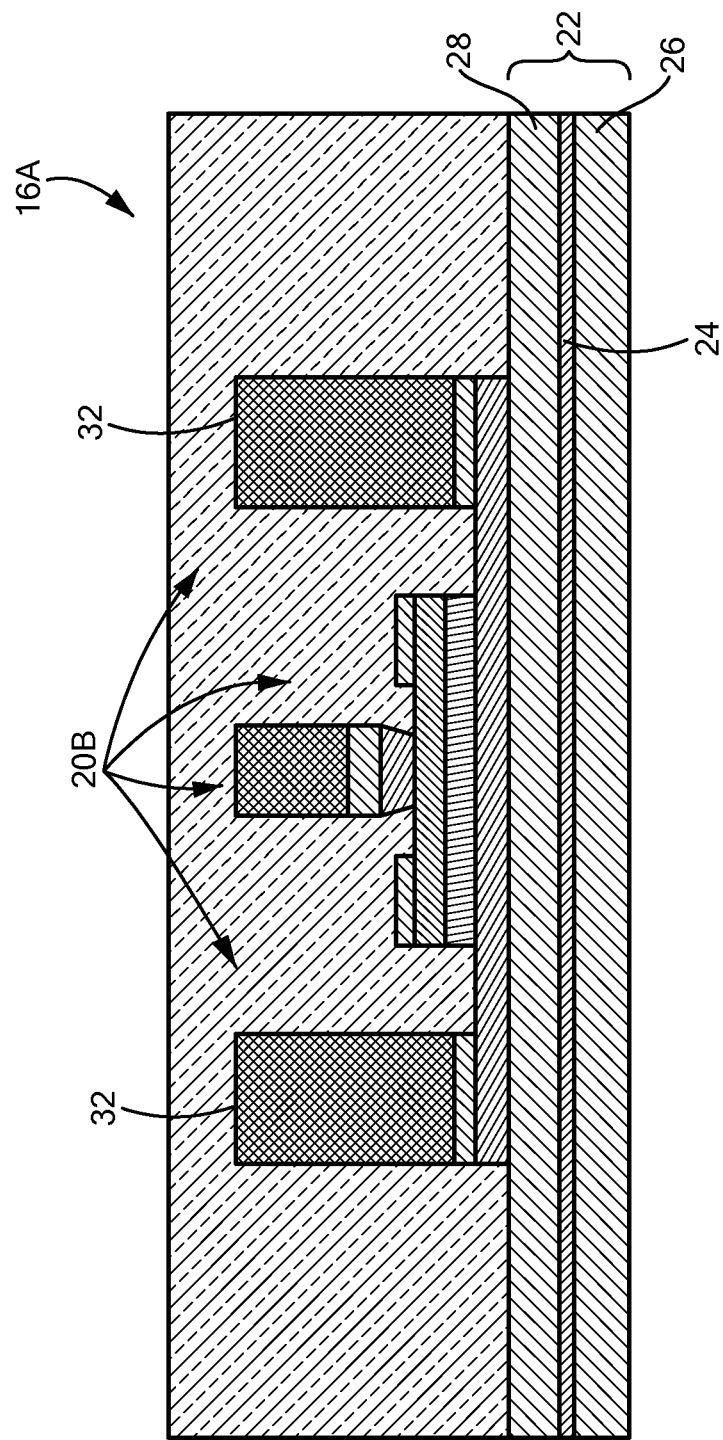
FIG. 4 schematically shows a cross-sectional view of a die of a donor wafer configured in accordance with illustrative embodiments of the invention. This figure corresponds to step 200 of the process in FIG. 2.

The process of FIG. 2 preferably uses bulk/plural fabrication techniques, which form a plurality of integrated circuits 10 on the same receiving wafer 18 at the same time. Although much less efficient, those skilled in the art can apply these principles to a process that forms only one integrated circuit 10. The process of FIG. 2 begins at step 200, which releases the dice on the donor wafer 16. To highlight this process, FIG. 4 schematically shows a cross-sectional view of a single donor die 16A of the donor wafer 16. This embodiment of the donor die 16A has circuitry 20B on a multi-layered substrate 22 having a release layer 24.

For example, the substrate 22 may be a conventional silicon-on-insulator wafer ("SOI wafer"), which, as known by those skilled in the art, has a so-called "handle wafer 26" coupled with a generally parallel so-called "device wafer 28" by means of an intervening oxide layer (forming the release layer 24). The circuitry 20B, which is formed on the device wafer 28, includes, in this example, high-performance circuitry and electrical contacts 32 for connecting with other devices.

Figure 5:
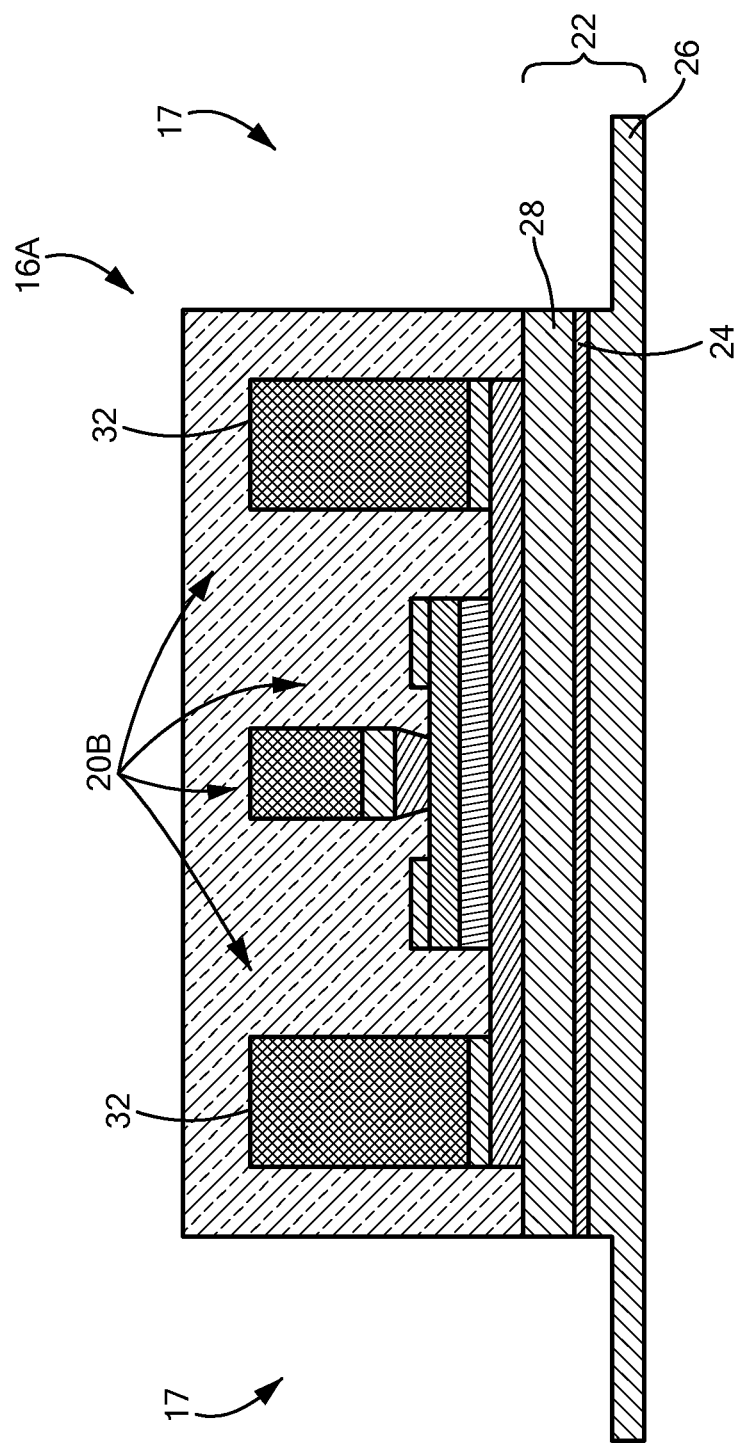
FIGS. 5 and 6 schematically show cross-sectional views of the die FIG. 4 as it is being processed to be moved. These figures correspond to step 200 of the process of FIG. 2.
Figure 6:
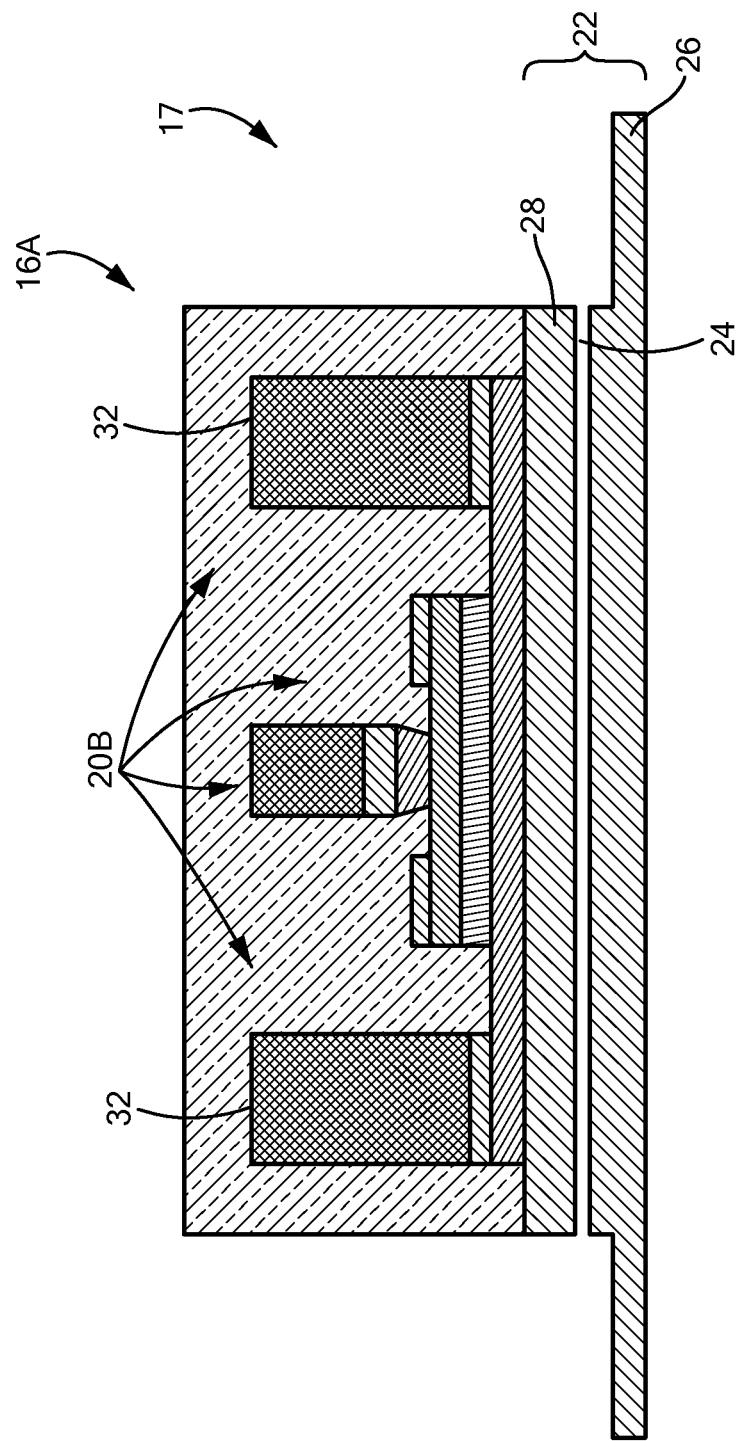

To release the donor die 16A from the donor wafer 16, illustrative embodiments first remove material between the donor dice 16A on the donor wafer 16 (FIG. 5) to separate the dice. Among other things, conventional sawing or similar processes may separate the dice along the prior noted scribe streets 17. Next, this step of the process etches the oxide between the two wafers of the SOI wafer (FIG. 6). For example, the donor wafer 16 may be subjected a hydrofluoric acid ("HF") in a manner that accesses and removes most or all of the oxide layer. Although not shown, the donor die 16A preferably still is weakly connected with the handle wafer 26 in some manner, such as with fragile micro-tethers. This connection ensures that the donor dice 16A maintain their current positions during the release process.

Figure 7:
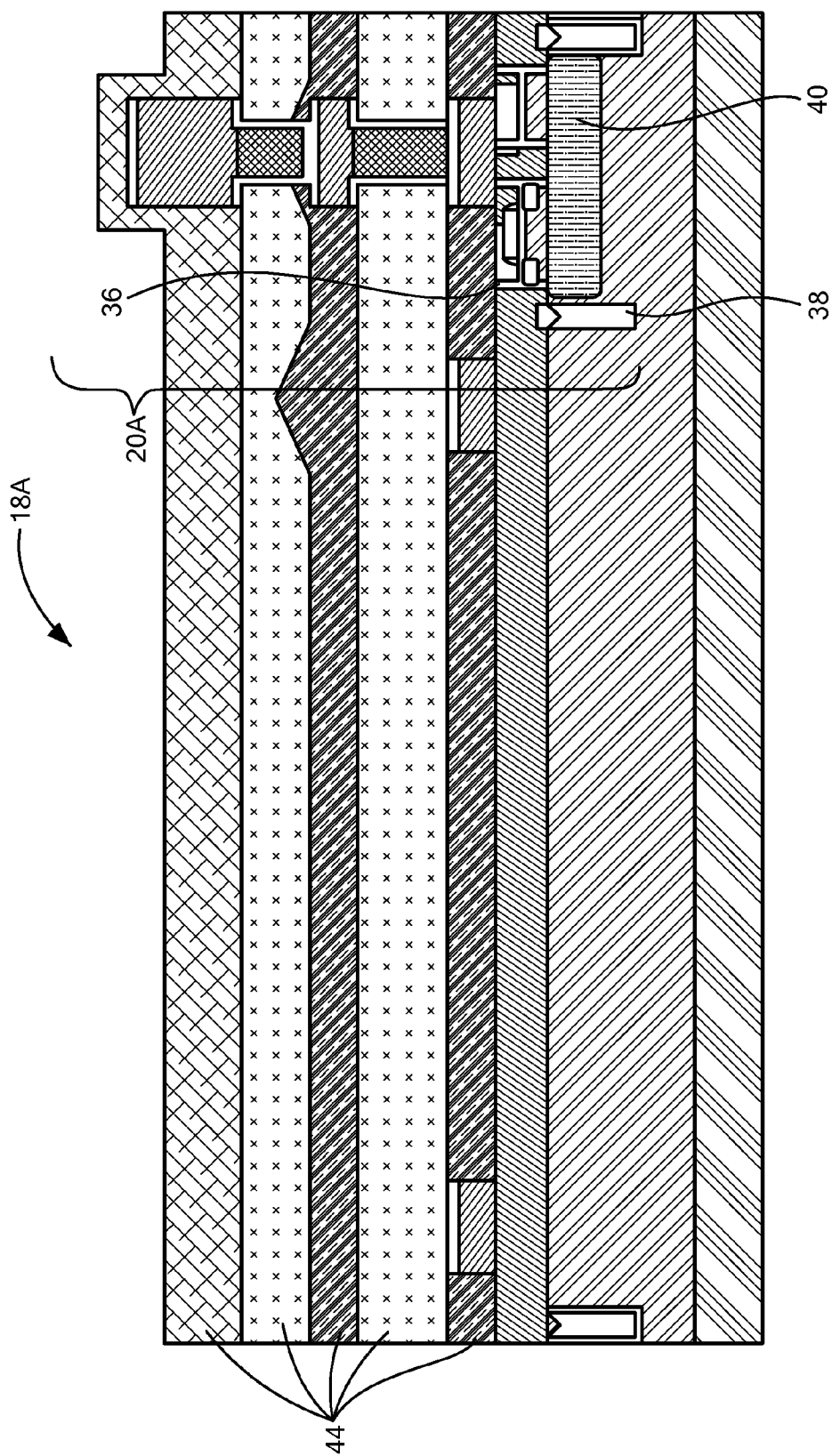
FIGS. 7 and 8 schematically show cross-sectional views of a die on a receiving wafer 18 respectively before-and-after processing to receive the receiving die FIG. 4. These figures correspond to step 202 of the process of FIG. 2.

After releasing the donor wafer 16, the process begins preparing the receiving wafer 18 to receive each of the donor dice 16A (step 202). To that end, FIG. 7 schematically shows a cross-sectional view of a single receiving die ("receiving die 18A") on the receiving wafer 18 before it is prepared to receive the donor die 16A. Indeed, FIG. 7 merely schematically shows one of a wide variety of implementations of a receiving die 18A that may be used with illustrative embodiments of the invention. Accordingly, specific features of the receiving die 18A are shown merely to help illustrate various embodiments of the invention.

In this example, the receiving die 18A has a plurality of layers, including a substrate 34 supporting circuitry 35 (e.g., CMOS circuitry). Like many other such devices, the receiving die 18A may have one or more wells 36 and filled vias 38, doped regions 40, etc. In addition, a plurality of passivation layers 44 cover the top surface. Some embodiments may use a single passivation layer 44, while in others, plural adjacent passivation layers 44 may be considered to form a single, unitary passivation layer 44.

Figure 8:
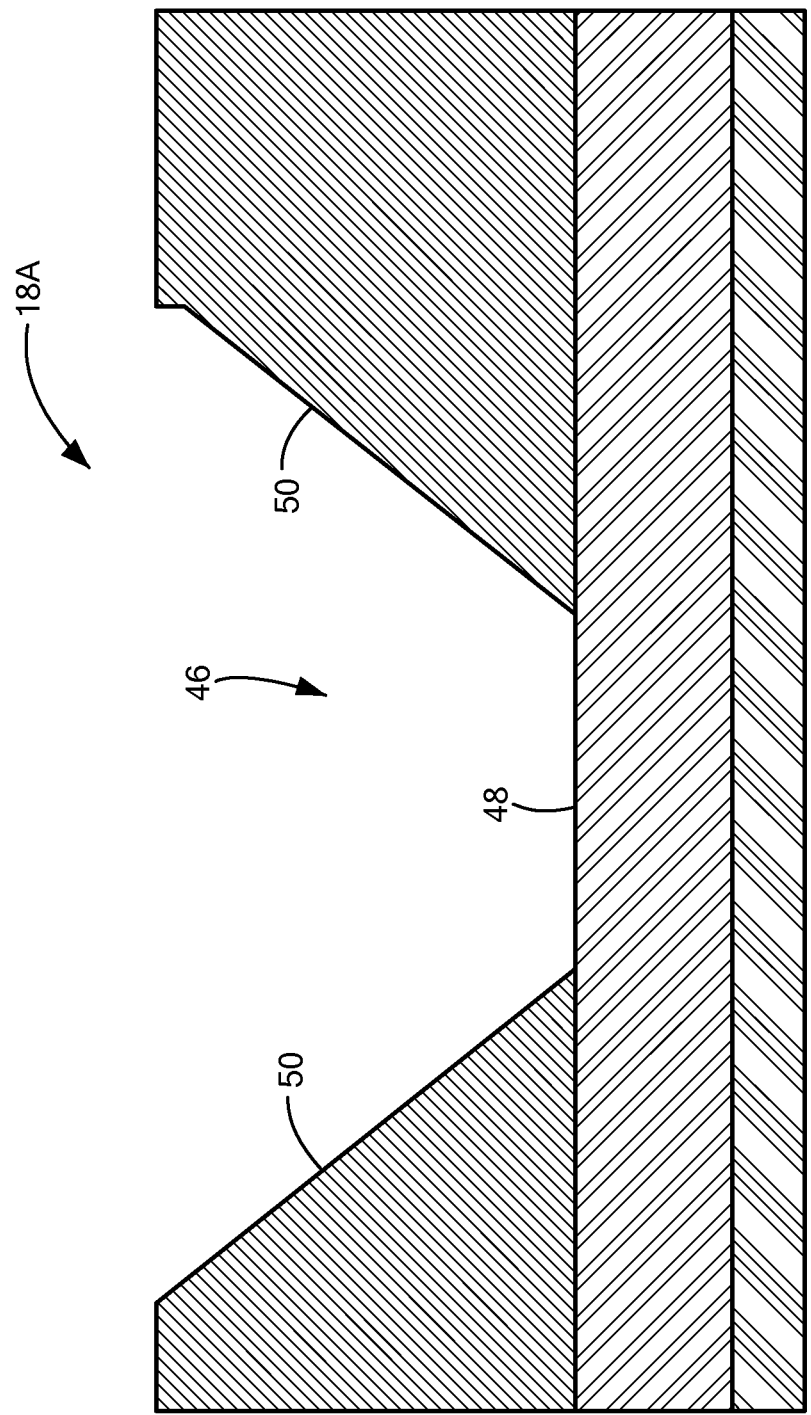

Illustrative embodiments do not simply position the donor die 16A on the top surface of the receiving die 18A. Instead, various embodiments remove one or more layers of the receiving die 18A to form a receiving aperture 46 that defines a receiving surface/area ("receiving surface 48"). It is this receiving surface 48 that ultimately supports the donor die 16A. Specifically, conventional processes pattern the receiving dice 18A on the receiving wafer 18 to form a plurality of receiving apertures 46 having receiving surfaces 48. FIG. 8 schematically shows a close-up, cross-sectional view one receiving die 18A portion. In particular, this figure more clearly shows the receiving aperture 46 and its receiving surface 48. As shown, step 202 etches through at least one of the layers (e.g., passivation layers 44 and non-passivation layers) to form one or more pre-configured walls 50 that define(s) the noted receiving surface 48.

In accordance with illustrative embodiments of the invention, these walls 50 are configured as an alignment structure (also identified using reference number "50") that aids in more precisely positioning the donor die 16A on the receiving surface 48. For example, the embodiment of FIG. 8 forms the walls 50 so that they are not orthogonal with the plane of the receiving surface 48. Instead, the walls 50 generally taper downwardly, from the perspective of FIG. 8, which, as discussed below, more precisely aligns the donor die 16A. The sides of the walls 50 may have any desired texture or features (e.g., protrusions, recesses, bumps, or grooves) that facilitate die placement. For example, the walls 50 may be very smooth, while other embodiments may have a sufficient roughness to substantially mitigate potential stiction issues.

Although this cross-sectional view shows at least one wall 50 (e.g., a conically shape may suffice), various embodiments may have a plurality of walls 50 configured to appropriately align the donor die 16A. For example, the receiving aperture 46 may have a plurality of generally planar wall(s) 50, wall(s) 50 having varying angles, and/or wall(s) 50 having a radius/curvature may suffice. The wall(s) 50 also may be oriented and configured to form a narrow guide structure that directs the donor die 16A into its precise position on the receiving surface 48.

Other embodiments may form only a single wall 50 as an alignment structure 50, while the rest of the wall 50 may be formed in another manner. For example, the left angled wall 50 of FIG. 8 may the substantially planar and angled as shown, while the right angled wall 50 of FIG. 8 may be orthogonal to the receiving surface 48. Of course, as noted above, both the left and right walls 50 of FIG. 8 may be part of a single wall 50. Accordingly, only part of such a single wall 50 may have the appropriate orientation and configuration.

In some embodiments, only a portion of one or more relevant walls 50 may have the appropriate orientation. For example, the right angled wall 50 of FIG. 8 has a portion that is substantially orthogonal to the plane of the receiving surface 48, and another portion that is not orthogonal to the plane of the receiving surface 48. Those skilled in the art can select the appropriate orientations, angles, and configurations for the wall 50 or walls 50 to ensure that the alignment structure 50 performs the desired alignment function.

Before, during, or after preparing the receiving wafer 18, the method may continue to step 204, which removes the donor dice 16A from the donor wafer 16. To that end, the method controls a die moving member 52 to substantially simultaneously couple with a plurality of the donor dice 16A on the donor wafer 16 (FIG. 9A), and then move upwardly to disconnect the dice from their tethers to the donor wafer 16 (FIG. 9B). If the rate at which the die moving member 52 moves upwardly is too slow, however, then some of the donor dice 16A may not untether from the donor wafer 16. Accordingly, those skilled in the art should select a speed that is sufficient to cleanly and effectively remove the donor dice 16A from their tethers.

Figure 9A:
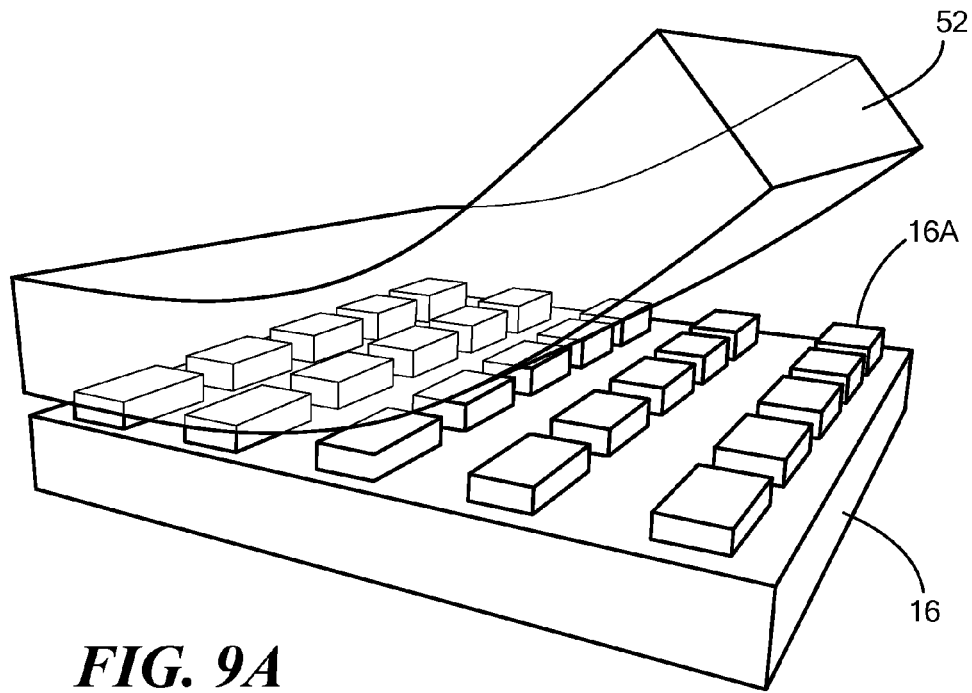
FIGS. 9A and 9B generically and schematically show a method of removing dice from the donor wafer in accordance with one embodiment of the invention. These figures correspond to step 204 of the process of FIG. 2.
Figure 9B:
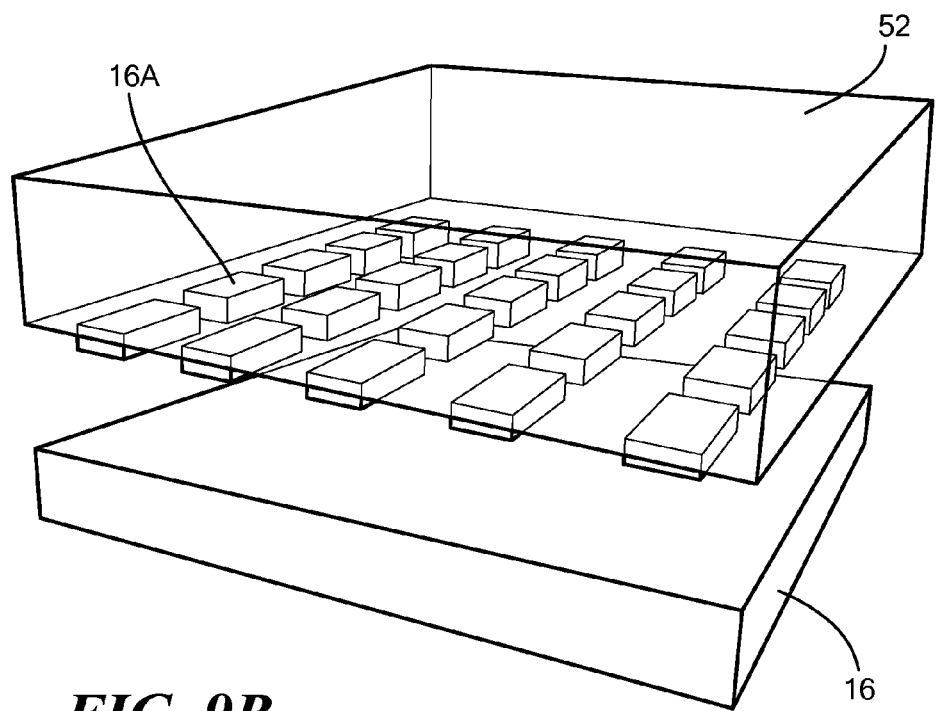

FIGS. 9A and 9B, for example, generically and schematically show a technique for removing dice from the donor wafer 16 using the die moving member 52. In this example, the die moving member 52 simultaneously couples with a two dimensional array of donor dice 16A on the donor wafer 16. This coupling may involve some or all of the dice on the donor wafer 16. In illustrative embodiments, each one of the selected dice 16A is positioned on the donor wafer 16 at a location that corresponds with a specific receiving surface 48 on the receiving wafer 18.

Figure 11:
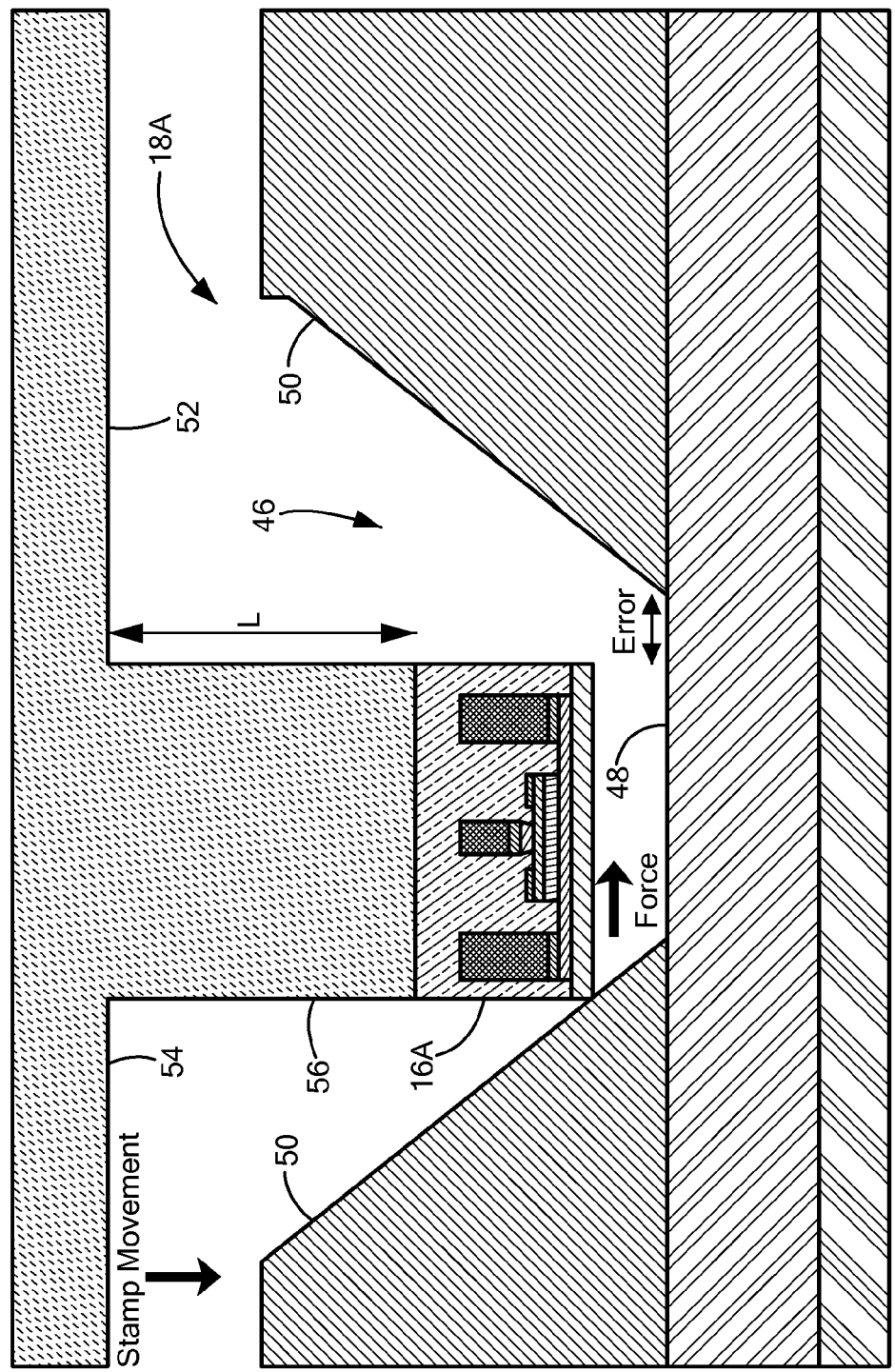
FIGS. 11 and 12 schematically show cross-sectional views of a dice moving member positioning dice from the donor wafer on the receiving wafer. These figures correspond to step 206 of the process of FIG. 2.
Figure 12:
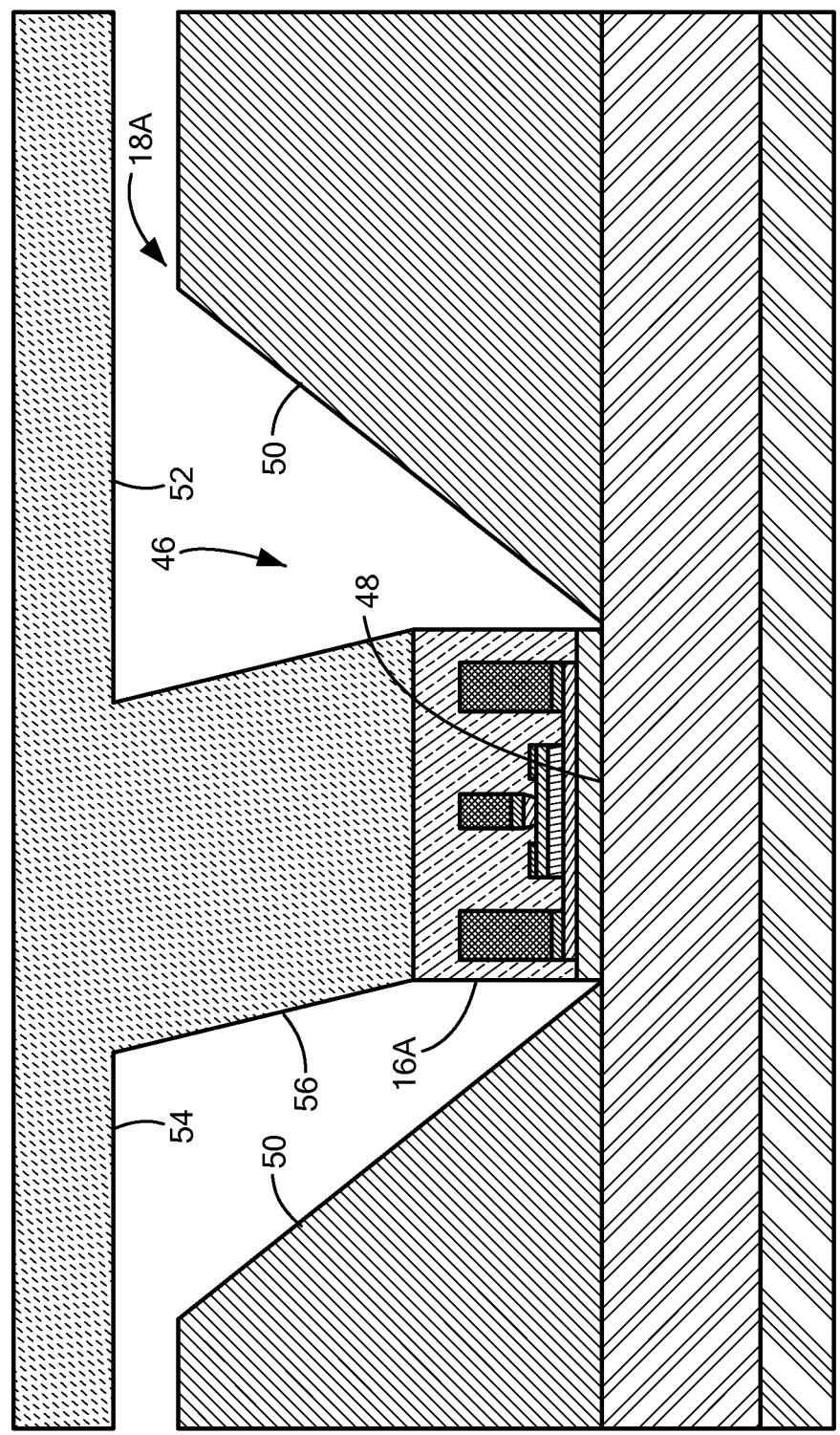

As shown, the die moving member 52 is formed from material that, upon contact, naturally couples with the dice. FIGS. 11 and 12, which are discussed in greater detail below with regard to step 206, show a cross-sectional view of one embodiment of the die moving member 52. In that embodiment, the die moving member 52 includes a top support region 54 that supports a plurality of downwardly extending, elongated die grasping portions 56. Accordingly, the die moving member 52 has a plurality of die grasping portions 56 for coupling with an appropriate number of donor dice 16A. For example, if the two dimensional array of donor dice 16A to be moved is configured as a 4×5 array, then the die moving a member preferably has a corresponding 4×5 array of die grasping portions 56.

The pattern of die grasping portions 56, however, may vary depending upon the pattern of donor dice 16A to be moved to the receiving wafer 18. For example, rather than coupling with all twenty donor dice 16A of the above noted 4×5 array, the die moving member 52 may have only 10 die grasping portions 56 that are positioned at locations corresponding to 10 intended receiving surfaces 48 on the receiving wafer 18. Those skilled in the art therefore can select the appropriate pattern for the die grasping portions 56 as a function of the layout of the receiving surfaces 48.

As discussed in greater detail below with regard to FIGS. 11 and 12, at least the die grasping portions 56 are formed from a flexible material having a relatively low Young's modulus. For example, at least the die grasping portion 56 may have a Young's modulus of less than about 1 MPa. Other embodiments, however, may have a higher Young's modulus. For example, part or all of the die moving member 52 may be implemented as a polymeric stamp formed from poly-dimethyl-siloxane ("PDMS"). Indeed, those skilled in the art can use other materials to accomplish same function.

The stamp/die moving member 52 can take on any of a wide variety of configurations to accomplish its function. For example, each die grasping portion 56 can be formed form a plurality of separate elongated members. The die grasping portion 56 preferably is sufficiently long enough (identified in FIG. 11 as length "L") so that it effectively forms a freely movable lever arm. In illustrative embodiments, this lever arm causes the die grasping portion 56 to more readily move when subjected to transverse forces (discussed below). In addition, the die grasping portion 56 also preferably is sufficiently long enough so that during the positioning phase, the bottom face of the top support region 54 does not contact the receiving wafer 18.

Figure 10A:
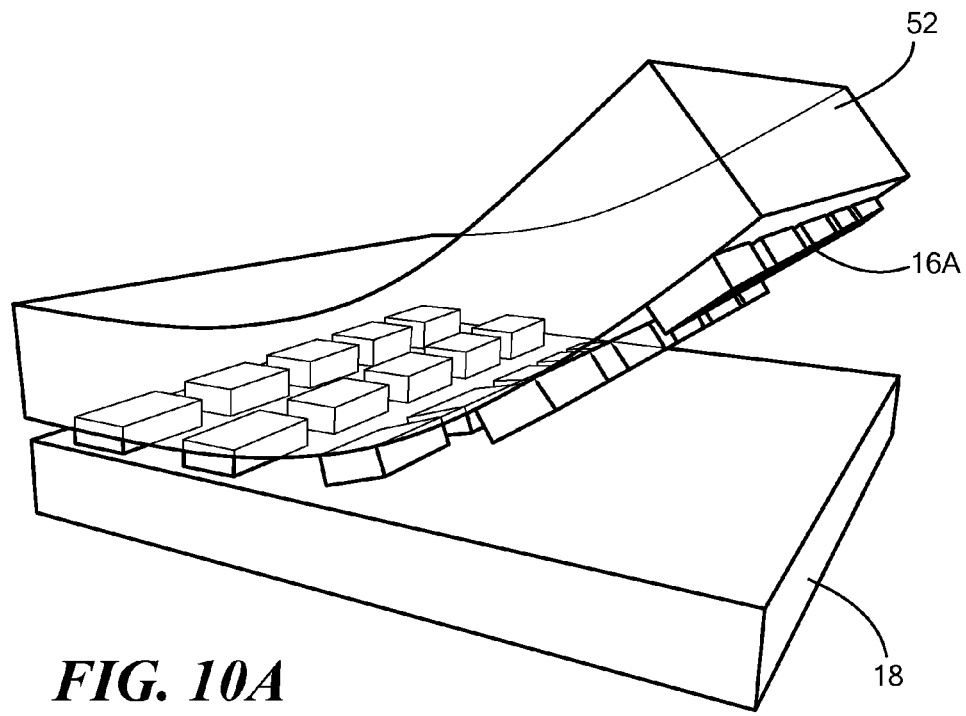
FIGS. 10A and 10B generically and schematically show a high-level method of positioning dice from the donor wafer on the receiving wafer 18. These figures correspond to step 206 of the process of FIG. 2.
Figure 10B:
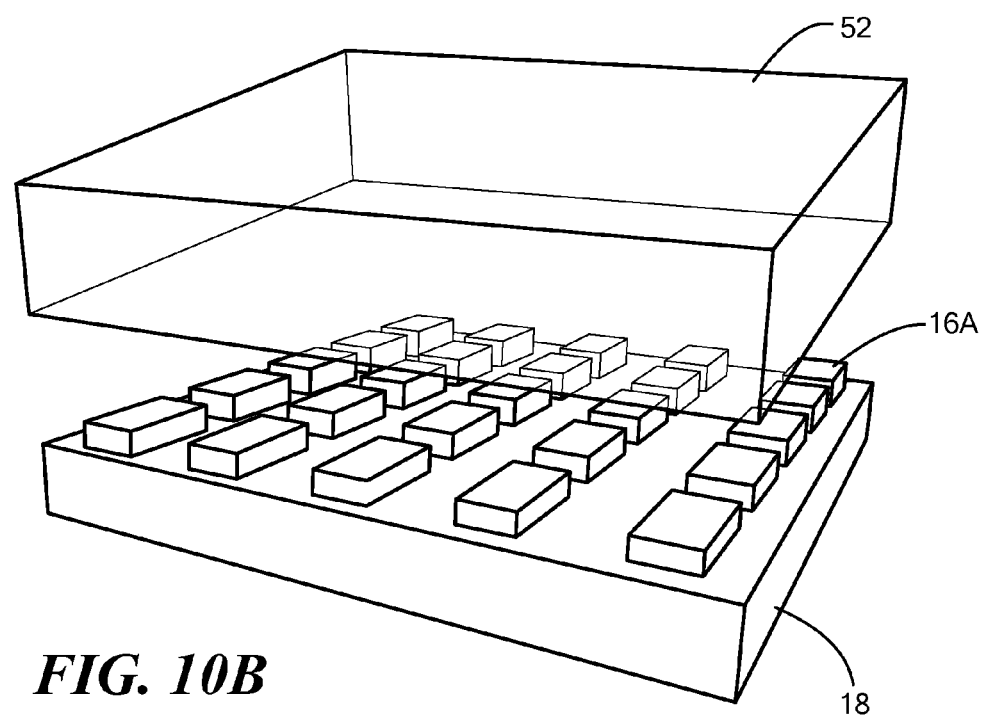

After removing the donor dice 16A from the donor wafer 16, the process positions the donor dice 16A on the receiving wafer 18 (step 206). FIGS. 10A and 10B generically and schematically show this step at a high-level across the array of donor dice 16A. FIGS. 11 and 12, however, more specifically show the positioning of one donor die 16A on its receiving wafer 18. Specifically, as shown in FIG. 11, the die moving member 52 lowers the donor die 16A downwardly into the receiving aperture 46 until it contacts the sidewall 50/alignment structure 50. This contact effectively applies a generally lateral force to the donor die 16A—a force that is generally parallel to the plane of the receiving surface 48. This downward movement preferably is relatively slow to more precisely position the dice in their respective receiving surfaces 48. Those skilled in the art can use test data from prior experimentation to arrive at an appropriate lowering speed. In the example of FIG. 11, the die moving member 52 is skewed toward the left of the drawing by a distance that is approximately the length of the "Error" arrow. In other words, the die moving member 52 has an error about equal to the Error arrow.

In response receipt to the lateral force from contact with the wall 50, the die grasping portion 56 bends or flexes, as shown in FIG. 12, as the donor die 16A continues to be slowly lowered toward the die receiving surface 48. Accordingly, during this process, the die effectively moves downwardly and laterally at substantially the same time until it contacts the receiving surface 48. When doing so, the donor die 16A slides along the wall 50 until it physically contacts the receiving surface 48.

The die moving member 52 may be configured to stop moving downwardly in response to feedback indicating contact on the receiving surface 48. To ensure appropriate positioning of the die, the die moving member 52 may be configured to explicitly lower the die to a location where it will contact the wall 50. This way, if the die moving member 52 does not need to be precise with its placement of the die in the receiving surface 48 (i.e., the Error of FIG. 11 is intended and tolerated by the process). Other embodiments, however, may configure the die moving member 52 to position the donor die 16A at a precise location on the receiving surface 48. In that case, the one or more walls 50 may be formed to define the receiving surface 48 with significant precision. Accordingly, even if the die moving member 52 erroneously attempts to lower the die beyond the tolerances of the process, the walls 50 preferably guide the die to the appropriate location.

The donor dice 16A preferably adhere or otherwise couple to the receiving surface 48 without requiring adhesive or other structure. In illustrative embodiments, Van der Waals forces preferably are sufficient enough to maintain the donor dice 16A on the receiving surface 48. To that end, the receiving surface 48 may be polished or otherwise have a surface with an appropriate surface energy that enables the donor dice 16A to remain in place on the surface when the die moving member 52 moves upwardly.

The process concludes by integrating the donor dice 16A with a receiving die 18A (step 208, FIGS. 13 and 17, both discussed below), and separating the receiving wafer 18 to produce the integrated circuit 10 of FIG. 1. Those skilled in the art that may perform additional post-processing steps, such as packaging the die (e.g., using a post-molded leadframe package 12 formed from copper and plastic), and testing the integrated circuit 10.

Figure 13:
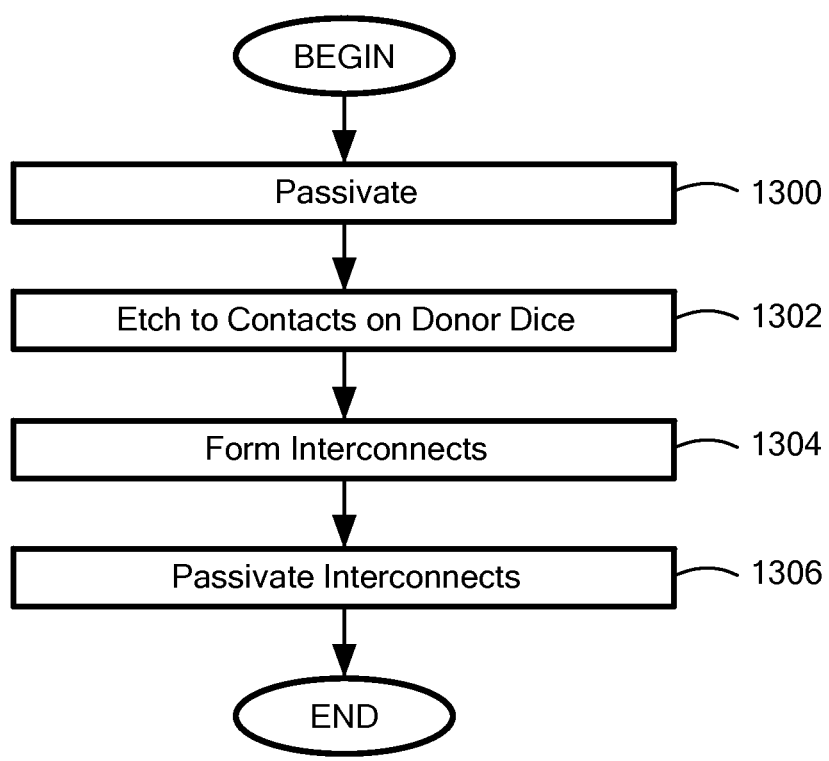
FIG. 13 shows a process of integrating dice from the donor wafer with dice on the receiving wafer in accordance with illustrative embodiments of the invention. This process corresponds to step 208 of the process of FIG. 2.

FIG. 13 shows a process of integrating the donor dice 16A with the receiving wafer 18 in accordance with illustrative embodiments of the invention. Specifically, this process describes step 208 of FIG. 2. In a manner similar to the process of FIG. 2, this process is substantially simplified from a longer process that normally would be used to form the integrated circuit 10. Accordingly, the process of integrating the dice has many steps, such as testing steps or additional passivation steps, which those skilled in the art likely would use. In addition, some of the steps may be performed in a different order than that shown, or at the same time. Those skilled in the art therefore can modify the process as appropriate. Moreover, as noted above and below, many of the materials and structures noted are but one of a wide variety of different materials and structures that may be used. Those skilled in the art can select the appropriate materials and structures depending upon the application and other constraints. Accordingly, discussion of specific materials and structures is not intended to limit all embodiments.

Figure 14:
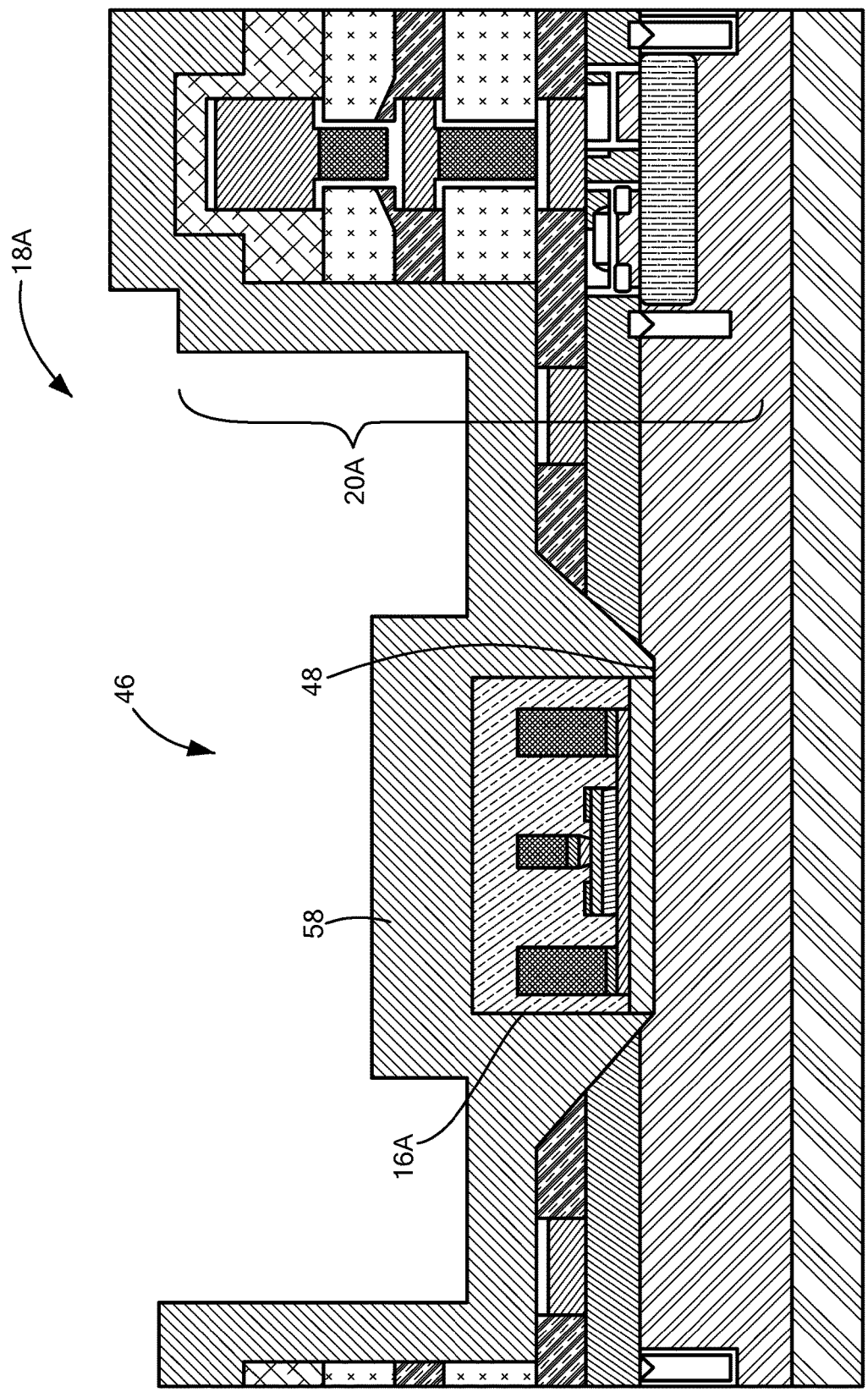
FIG. 14 schematically shows a cross-sectional view of the receiving wafer with passivation added over the donor die. This figure corresponds to step 1300 of the process of FIG. 13.

The process of FIG. 13 begins at step 1300, which passivates the receiving die 18A and its coupled donor die 16A. FIG. 14 schematically shows one embodiment of the donor die 16A and receiving die 18A at this stage of the process. To that end, the method may deposit a dielectric/passivation layer 58 over the top of some or all of the receiving die 18A. For example, the method may deposit silicon dioxide using a low temperature chemical vapor deposition process. To ensure the integrity of the donor die 16A and receiving die 18A, the process deposits this layer at a low temperature, such as below about 400 degrees Celsius. Accordingly, at the conclusion of step 1300, the donor die 16A is substantially physically integrated with the receiving die 18A. The two dice 16A and 18A, however, are not electrically connected at this point of the process.

Figure 15:
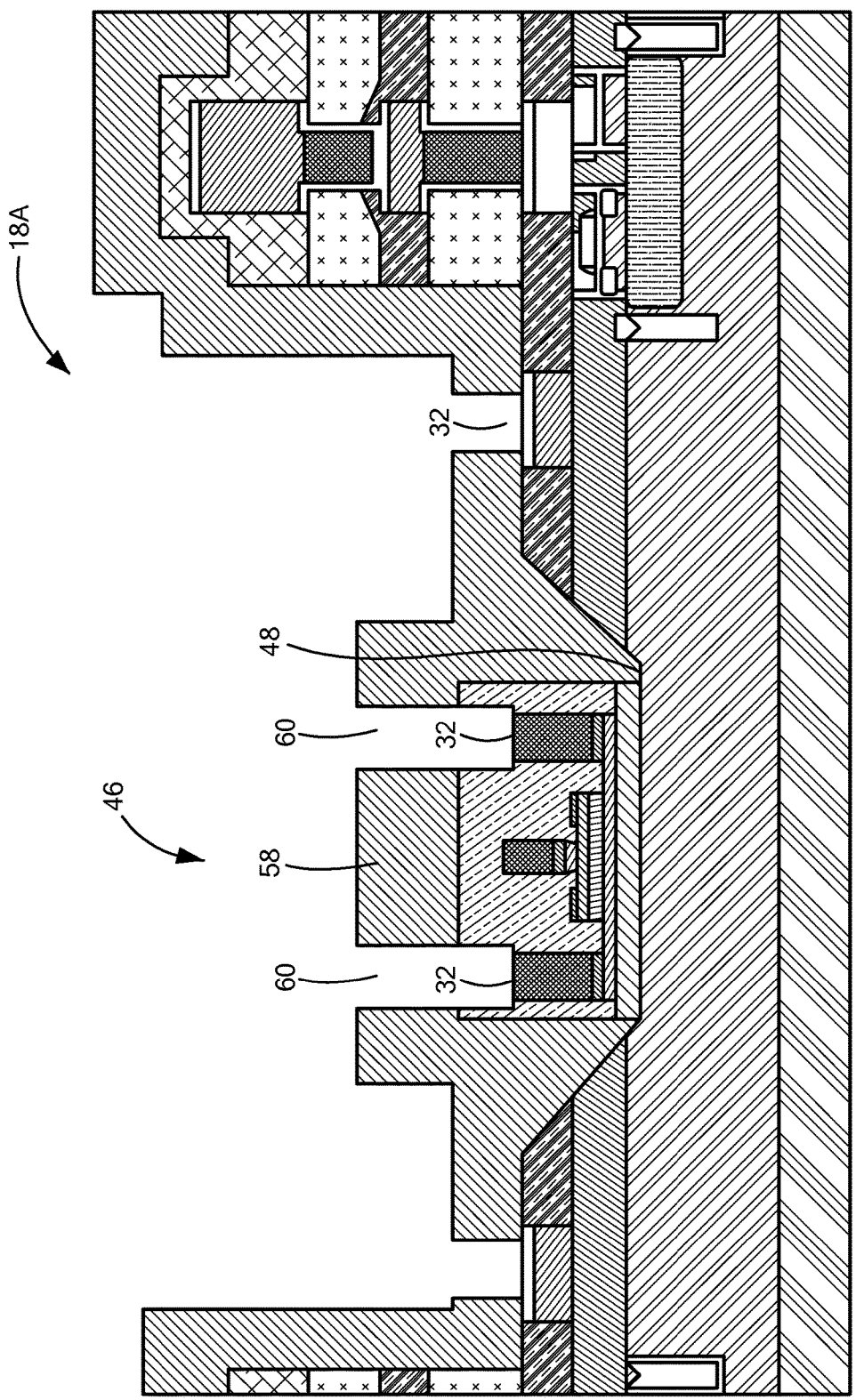
FIG. 15 schematically shows a cross-sectional view of the receiving wafer with vias etched to the donor die. This figure corresponds to step 1302 of the process of FIG. 13.

To provide that electrical connection, the process continues to step 1302, which creates access to the respective electrical contacts 32 of the donor die 16A and the receiving die 18A. FIG. 15 schematically shows one embodiment of the donor die 16A and receiving die 18A at this stage of the process. In this embodiment, conventional processes etch vias 60 through the dielectric passivation layer 58 deposited by step 1300, and other passivation in the top portion of the donor die 16A. To that end, the method may pattern the passivated receiving wafer 18 by depositing photoresist with known photo-lithography techniques to form the vias 60.

Figure 16:
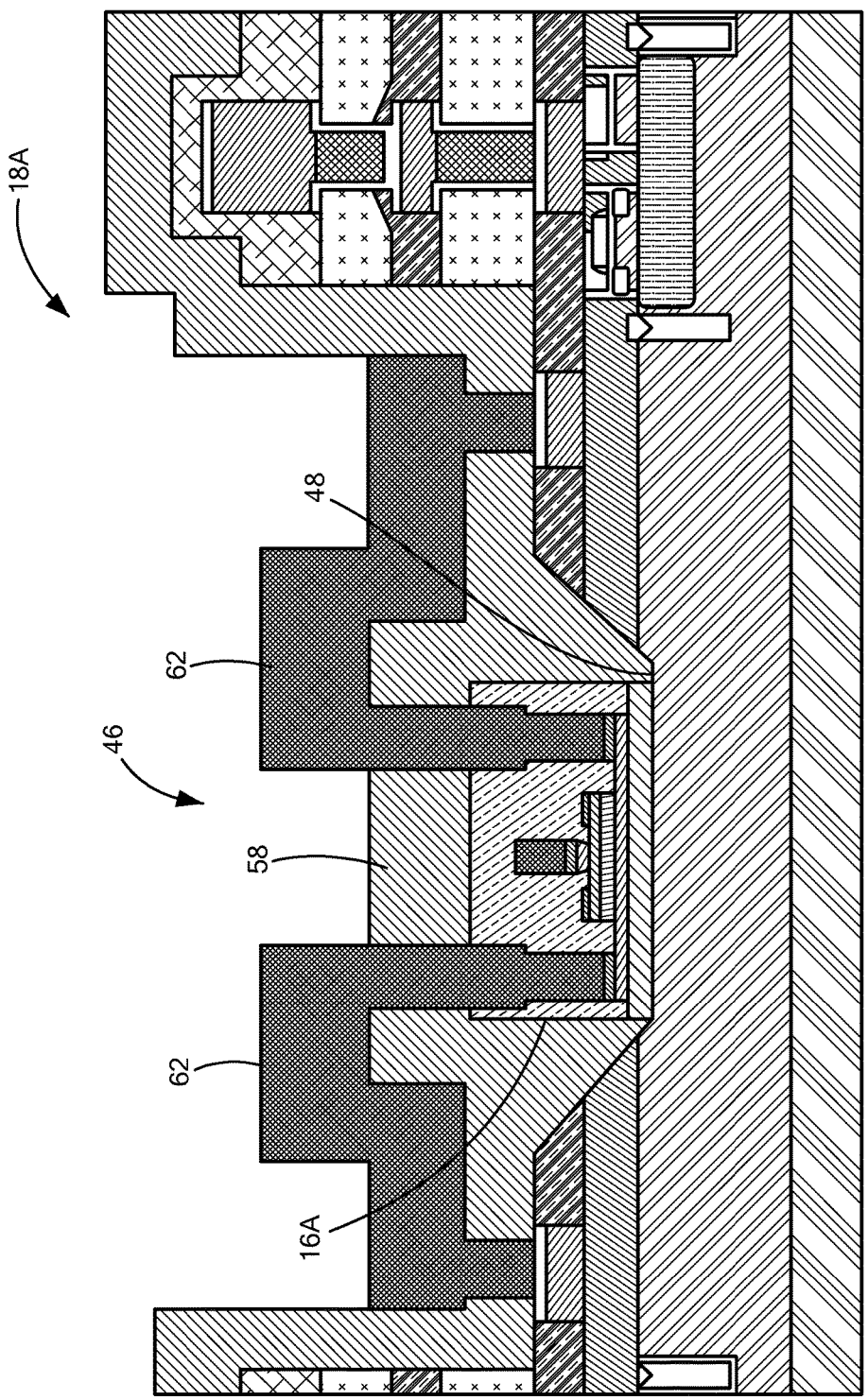
FIG. 16 schematically shows a cross-sectional view of the receiving wafer with metal deposited to electrically interconnect the donor die with the receiving die. This figure corresponds to step 1304 of the process of FIG. 13.

With the metal contacts 32 of the two integrated dice 16A and 18A exposed, the process now moves to step 1304, which forms electrical interconnects 62 between contacts 32 of the donor die 16A and the receiving die 18A. FIG. 16 schematically shows the donor die 16A and receiving die 18A at this stage of the process. To that end, the method may form the electrical interconnects 62 using conventional metal deposition, photoresist deposition, and photo-lithographic processes. This step also may etch the deposited metal to ensure precise electrical interconnections.

Figure 17:
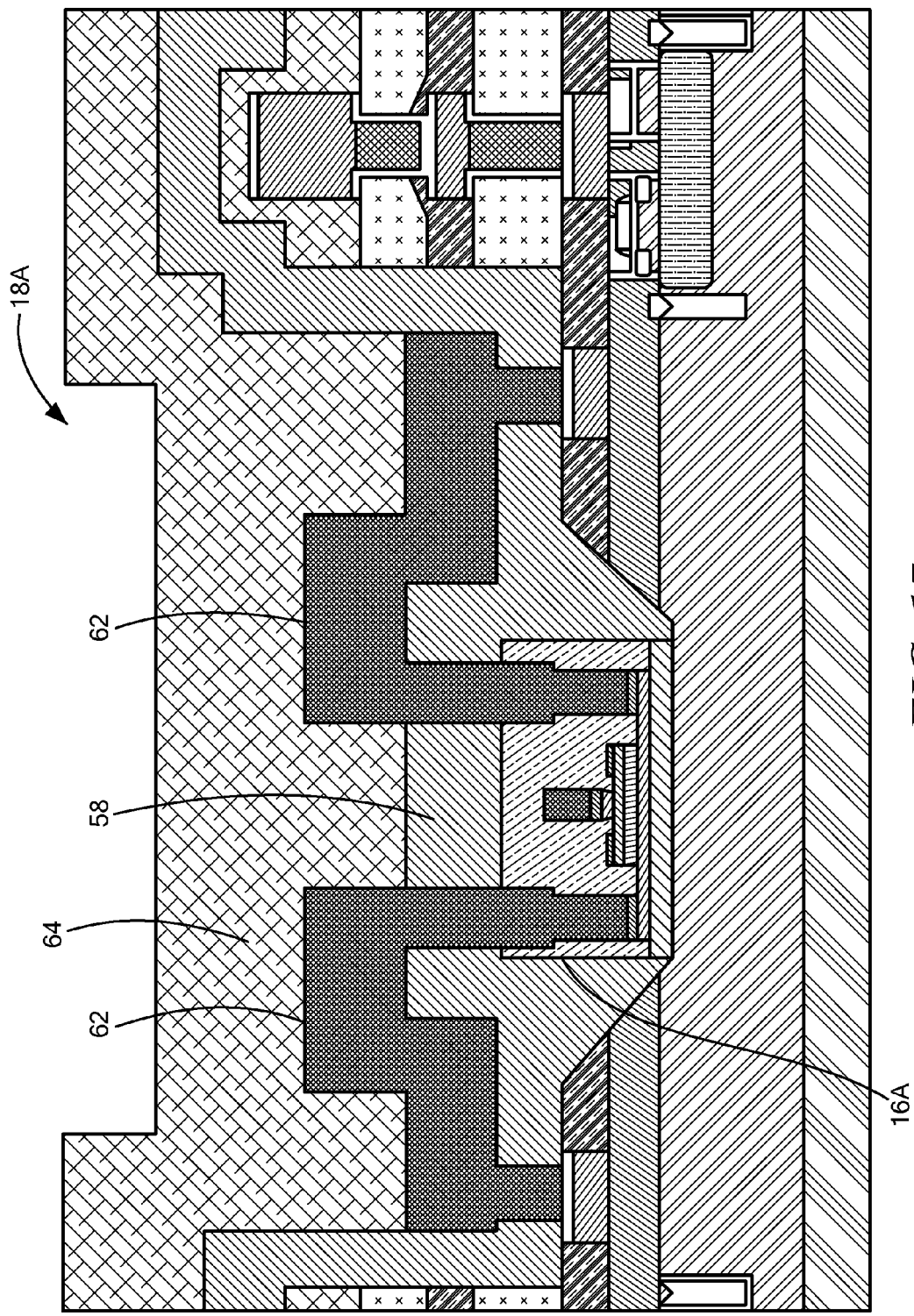
FIG. 17 schematically shows a cross-sectional view of the receiving wafer with additional passivation added over the two dice. This figure corresponds to step 1306 of the process of FIG. 13.

The process concludes at step 1306, which applies further passivation 64 to the metal interconnects 62 deposited during step 1304 (FIG. 17). Although not shown, this step also selectively opens this additional layer of passivation 64 to expose the appropriate pads/interconnects 62 to the outside surface of this newly formed monolithic die.

As noted, the specific structure of the above noted embodiments is illustrative of some embodiments. For example, although the alignment structure 50 of FIG. 3 and other figures is formed as a preconfigured wall 50, some embodiments may form the alignment structure 50 as any of a number of other modalities (those alternative structures of the alignment structure 50 are schematically shown in the figures as the walls 50, although they may not necessarily involve the walls). For example, in another embodiment, the alignment structure 50 on the receiving wafer 18 may take the form of a first thin magnetic film deposited and patterned at or near their receiving surface 48. In this case, this first magnetic film interacts with a second thin magnetic film deposited and patterned on the bottom side of the donor dice 16A. Among other ways, after the donor dice 16A are removed from the donor wafer 16 (i.e., after step 204), illustrative embodiments may form the noted magnetic film on their bottom side.

During step 202, illustrative embodiments may form the noted thin magnetic film at or near the receiving surface 48 of the receiving wafer 18. Accordingly, when the die moving member 52 moves the die downwardly toward the receiving surface 48, the thin magnetic films should cause the donor die 16A to move to the appropriate position.

Alternative embodiments may use other modalities for implementing the alignment structure 50. For example, rather than using magnetic films, alternative embodiments may use electrostatic forces to align the donor die 16A with the receiving surface 48. Those skilled in the art can make the appropriate modifications to the receiving wafer 18 to produce the appropriate electrostatic forces. Yet other embodiments may pattern part of the receiving die 18A and/or receiving apertures 46 to have hydrophilic or hydrophobic outer surfaces. In that case, the surfaces of the donor die 16A and the receiving aperture 46 interact to precisely align the donor die 16A to the receiving surface 48 when subjected to an aqueous fluid.

Indeed, some embodiments may combine multiple alignment structures 50 and modalities for these purposes. For example, some embodiments may configure the alignment structure 50 to have both the walls 50 and magnetic films. Those skilled in the art can select the appropriate modality.

Accordingly, various embodiments more precisely integrate two dice formed from separate, often incompatible processes into a single monolithic circuit. Illustrative embodiments therefore do not require highly precise equipment to properly position the two dice relative to each other. Moreover, the monolithic integrated device of FIG. 1 can be rapidly produced in parallel with other like devices to have reduced parasitics between the donor die 16A and the receiving die 18A.

Although the above discussion discloses various exemplary embodiments of the invention, it should be apparent that those skilled in the art can make various modifications that will achieve some of the advantages of the invention without departing from the true scope of the invention.

What is claimed is:

1. A transfer printing method for steerably aligning dice from different wafers, the method comprising:

providing a first wafer having a first die and an alignment structure, the first die having a receiving surface, the alignment structure comprising at least one wall that is non-orthogonal to the receiving surface;

removing, using a die moving member, a second die from a second wafer, the second die from the second wafer in contact with a flexible protrusion of the die moving member; and positioning the second die on the receiving surface of the first die by sliding the second die downward and laterally along the at least one wall until the second die is laterally translated a threshold distance and contacts the receiving surface without deforming the second die.

2. The method of claim 1, wherein the alignment structure is configured to at least in part control movement of the die moving member to position the second die on the receiving surface.

3. The method of claim 1, wherein the die moving member comprises an elongated portion configured to flex laterally to translate the second side the threshold distance.

4. The method of claim 1, wherein the die moving member comprises a stamp formed at least in part from a flexible material having a Young's Modulus of less than about 1 MPa.

5. The method of claim 1, further comprising a magnetic structure configured to combine with the alignment structure to at least in part control movement of the die moving member.

6. The method of claim 1, further comprising an electrostatic structure configured to combine with the alignment structure to at least in part control movement of the die moving member.

7. The method of claim 1, further comprising passivating the second die and electrically connecting the second die to the first die.

8. A transfer printing method for steerably aligning dice from different wafers, the method comprising:
providing a first wafer having first die, the first dice comprising a receiving surface and semiconductor circuitry;
removing, using a die moving member comprising a flexible protrusion, a second die from a second wafer; and
positioning, by moving the second die in a direction normal to the receiving surface of the first die, the second die on the receiving surface, by flexing the die moving member parallel to the receiving surface to slide the second die along at least one wall of an alignment structure formed on the first wafer until the second die is laterally translated a threshold distance and contacts the receiving surface.

9. The method of claim 8, wherein the semiconductor circuitry of the first die is formed in a first semiconductor process, and the second die is formed in a second semiconductor process, the first and second processes being different semiconductor processes.

10. The method of claim 8, wherein the die moving member comprises an elongated portion configured to both: A) flex laterally to translate the second side the threshold distance, and B) move in the direction normal to the receiving surface.

11. The method of claim 8, further comprising a magnetic structure configured to combine with the alignment structure to at least in part control movement of the at least one die moving member.

12. The method of claim 8, further comprising an electrostatic structure configured to combine with the alignment structure to at least in part control movement of the at least one die moving member.

13. A transfer printing method for steerably aligning dice from different wafers, the method comprising:
providing a first wafer having a first die, the first die comprising a receiving surface, the receiving comprising at least one wall;
providing a second wafer having a second die;
controlling a die moving means for moving the second die from the second wafer to the first wafer; and
positioning, using the die moving means, the second die on the receiving surface of the first die by sliding the second die downward and laterally along the at least one wall until the second die is laterally translated a threshold distance and contacts the receiving surface.

14. The transfer printing method of claim 13, wherein the controlling means comprises means for magnetically or electrostatically interacting with the second die or the die moving means.

15. The transfer printing method of claim 13, wherein the die moving means comprises a flexible die moving member that is configured to laterally translate the second die by flexing in a lateral direction.

16. The method of claim 1, wherein the second die comprises group III-V semiconductor circuitry.

17. The method of claim 16, wherein semiconductor circuitry of the first die comprise silicon circuitry.

18. The method of claim 8, wherein the second die comprises III-V semiconductor circuitry.

19. The method of claim 13, wherein the first die further comprises CMOS circuitry and the second die comprises III-IV semiconductor circuitry.

20. The method of claim 1, wherein a portion of die moving member contacting the second die is flexible enough to permit lateral steering of the second die while the second die is being pushed into place onto the first die by the portion of the die moving member.

* * * * *